(12) United States Patent
Zhang et al.

(10) Patent No.: US 7,781,895 B2
(45) Date of Patent: Aug. 24, 2010

(54) VIA ELECTROMIGRATION IMPROVEMENT BY CHANGING THE VIA BOTTOM GEOMETRIC PROFILE

(75) Inventors: Bei Chao Zhang, Singapore (SG); Chun Hui Low, Johor (MY); Hong Lim Lee, Penang (MY); Sang Yee Loong, Singapore (SG); Qiang Guo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 12/486,521

(22) Filed: Jun. 17, 2009

(65) Prior Publication Data

US 2009/0250818 A1 Oct. 8, 2009

Related U.S. Application Data

(62) Division of application No. 11/374,848, filed on Mar. 13, 2006, now Pat. No. 7,691,739, and a division of application No. 10/692,028, filed on Oct. 23, 2003, now Pat. No. 7,045,455.

(51) Int. Cl.
*H01L 23/48* (2006.01)
*H01L 23/52* (2006.01)
*H01L 29/40* (2006.01)

(52) U.S. Cl. ............................ 257/774; 257/E23.011
(58) Field of Classification Search ............... 257/774, 257/E23.011
See application file for complete search history.

(56) References Cited

U.S. PATENT DOCUMENTS 5,272,101 A    12/1993   Forouhi et al.
5,429,710 A *   7/1995   Akiba et al. .............. 438/714
5,470,790 A *  11/1995   Myers et al. .............. 438/625
5,545,289 A     8/1996   Chen et al.
5,630,904 A     5/1997   Aoyama et al.
5,637,534 A     6/1997   Takeyasu et al.
5,702,956 A    12/1997   Ying et al.
5,709,756 A     1/1998   Ward et al.
5,827,778 A    10/1998   Yamada
5,976,986 A    11/1999   Naeem et al.
5,981,378 A    11/1999   Bothra
6,004,876 A    12/1999   Kwon et al.
6,006,764 A    12/1999   Chu et al.
6,011,311 A *   1/2000   Hsing et al. .............. 257/774
6,013,574 A     1/2000   Hause et al.
6,033,993 A     3/2000   Love, Jr. et al.
6,069,072 A     5/2000   Konecni et al.
6,080,660 A     6/2000   Wang et al.
6,090,674 A     7/2000   Hsieh et al.

(Continued)

*Primary Examiner*—David A Zameke (57) ABSTRACT

An integration approach to improve electromigration resistance in a semiconductor device is described. A via hole is formed in a stack that includes an upper dielectric layer, a middle TiN ARC, and a lower first metal layer and is filled with a conformal diffusion barrier layer and a second metal layer. A key feature is that the etch process can be selected to vary the shape and location of the via bottom. A round or partially rounded bottom is formed in the first metal layer to reduce mechanical stress near the diffusion barrier layer. On the other hand, a flat bottom which stops on or in the TiN ARC is selected when exposure of the first metal layer to subsequent processing steps is a primary concern. Electromigration resistance is found to be lower than for a via structure with a flat bottom formed in a first metal layer.

12 Claims, 4 Drawing Sheets

U.S. PATENT DOCUMENTS

| | | | |
|---|---|---|---|
| 6,100,184 A | 8/2000 | Zhao et al. | |
| 6,130,154 A | 10/2000 | Yokoyama et al. | |
| 6,133,142 A | 10/2000 | Tran et al. | |
| 6,162,724 A | 12/2000 | Hsia et al. | |
| 6,165,895 A | 12/2000 | Lin | |
| 6,218,283 B1 * | 4/2001 | Park et al. | 438/622 |
| 6,222,272 B1 * | 4/2001 | Takayama et al. | 257/773 |
| 6,274,475 B1 | 8/2001 | Shields | |
| 6,306,732 B1 | 10/2001 | Brown | |
| 6,383,920 B1 | 5/2002 | Wang et al. | |
| 6,433,428 B1 * | 8/2002 | Watanabe et al. | 257/750 |
| 6,451,181 B1 | 9/2002 | Denning et al. | |
| 6,522,013 B1 * | 2/2003 | Chen et al. | 257/774 |
| 6,548,905 B2 * | 4/2003 | Park et al. | 257/762 |
| 6,551,919 B2 | 4/2003 | Venkatesan et al. | |
| 6,613,664 B2 * | 9/2003 | Barth et al. | 438/629 |
| 6,884,710 B2 * | 4/2005 | Park et al. | 438/614 |
| 7,041,605 B2 * | 5/2006 | Lee | 438/739 |

* cited by examiner

VIA ELECTROMIGRATION IMPROVEMENT BY CHANGING THE VIA BOTTOM GEOMETRIC PROFILE

CROSS-REFERENCE TO RELATED APPLICATION(S)

This is a divisional of co-pending U.S. Non-Provisional patent application Ser. No. 11/374,848, filed Mar. 13, 2006, which is a divisional of U.S. Non-Provisional patent application Ser. No. 10/692,028, filed Oct. 23, 2003, now U.S. Pat. No. 7,045,455, and the subject matter thereof is hereby incorporated herein be reference thereto.

FIELD OF THE INVENTION

The invention relates to the field of fabricating integrated circuits and other electronic devices and in particular to an improved via structure and method for forming a via that leads to improved electromigration resistance and better device reliability.

BACKGROUND OF THE INVENTION

During the so called "back end of line" (BEOL) portion of fabricating a microelectronic device, several metal layers are stacked on each other in a packaging operation. The metal wiring is separated by insulating layers comprised of dielectric material to prevent undesirable crosstalk between the metal layers. Interconnects in the form of vias and trenches are used to form electrical pathways through the dielectric material between the metal layers. As the size of a circuit shrinks to enable faster speeds for devices and a higher density to accommodate more chips per substrate and increased productivity, there is a significant challenge to manufacture vias with the appropriate size and shape to optimize device performance.

Reliability is also an increasing concern as interconnects become smaller and higher current densities are employed. There is a significant effort to manufacture devices in which failure mechanisms are substantially delayed or prevented from occurring by a judicious selection of material components and architecture. One leading cause of device failure is electromigration which is the movement of metal ions in a conductive element as a result of a current passing through it. A current typically flows from one metal line through a diffusion barrier at the bottom of a via and then through the via before reaching a second metal line. A compressive stress builds up on the upstream side of the diffusion barrier while a tensile stress increases with time on the opposite side of the barrier. There tends to be a movement of metal that leads to void formation in locations of tensile stress such as immediately downstream in the current flow from a diffusion barrier. Thus, the bottom of a conductive layer in a via hole is especially susceptible to void formation due to electromigration. A via structure for improving resistance to electromigration and a method of forming an improved via structure are needed to achieve better reliability.

Although copper is rapidly replacing aluminum in metal wiring because of its lower resistivity, Cu is more difficult to etch since its halides are not volatile and cannot be swept out of an etch chamber in the exhaust flow. As an alternative, an Al/Cu alloy may be used as a metal interconnect in situations where metal etching is practiced.

One prior art method to improve electromigration resistance is found in U.S. Pat. No. 6,080,660 where a first etch is used to form a via in a dielectric layer above a conductive line and a second etch step is used to remove a TiN layer on the metal line as well as part of the metal line. The method is useful in correcting a notch at the bottom of a misaligned via that can lead to void formation and a loss in reliability. A slanting but planar surface is produced on the metal line which enables a good interface with a subsequently deposited metal layer.

In U.S. Pat. No. 6,004,876, a low resistance interconnect with improved reliability is described and involves insertion of a Ti reaction prevention layer between a first metal layer and a TiN anti-reflective coating (ARC) on the first metal layer. The method prevents AlN from forming during deposition of TiN on an Al layer and avoids AlF formation when $WF_6$ is used to deposit a W plug in a via above the Al conductive layer.

An imperfect diffusion barrier layer at the bottom of a via is claimed in U.S. Pat. No. 6,306,732 to control electromigration by reducing stress build up in a metal layer adjacent to a diffusion barrier layer. A limited flow of metal atoms is allowed through the bottom of the imperfect barrier to replace the metal depleted in the downstream side of the barrier.

A punch through via with a conformal barrier liner is mentioned in U.S. Pat. No. 6,522,013. A via is etched through a TiN ARC layer and into a first metal layer to give a concave bottom that has an undercut shape on the bottom corners. A TiN barrier layer is deposited in the via by a chemical vapor deposition (CVD) process that forms a conformal layer which is treated with a $N_2/H_2$ plasma to reduce resistivity. However, a specification for the concave shape at the via bottom is not taught or suggested. Furthermore, there is no flexibility to vary the shape depending upon the stress encountered in a particular device, the type of metal alloy, and other process issues.

Therefore, a via structure is needed that has a shape which can be modified to relieve stress in a particular product design and thereby improve electromigration resistance and reliability. It is desirable to have a via structure, with a flexible bottom shape that can be formed in a first metal layer or stopped on a layer above the first metal layer. The method to form the improved via structure should be well controlled so that the shape can be accurately reproduced in a manufacturing environment. Moreover, the method should be compatible with a variety of materials used as a diffusion barrier layer and metal layer to fill the via.

SUMMARY OF THE INVENTION

An objective of the present invention is to provide a via structure that relieves stress near the interface between the bottom of the via and an underlying metal line and thereby increases electromigration resistance and improves device reliability, A further objective of the present invention is to improve electromigration resistance by providing a via structure which prevents materials in subsequent processes from attacking an underlying metal line that is in the same electrical path as the via.

A still further objective of the present invention is to provide a method for forming a via hole with a bottom curvature that is etched through a dielectric layer and into an underlying metal layer.

Yet another objective of the present invention is to provide a method for forming a via hole that is etched through a dielectric layer and stops on or in an ARC layer above a metal layer.

Still another objective of the present invention is to provide a method for forming a via hole with a flexible bottom shape that is selected based on the type of materials in the adjacent layers, the materials used to fill the via, and the architecture which will have the least electromigration resistance.

To achieve these objectives, the invention provides a unique via structure and method of manufacture. In a first embodiment, a substrate is provided with a stack comprised of a lower first metal layer, a middle TiN ARC layer, and an upper dielectric layer. A photoresist is coated and patterned on the dielectric layer to form a via opening. A plasma etch process then follows that transfers the opening having a diameter D through the dielectric and TiN layers and into the first metal layer. A key feature is that the etch process generates a curvature at the via bottom. The lower portion of a circle having a radius R defines the curved bottom shape. R may vary from a maximum size that is 1.5 times greater than D to a minimum size where R is about 0.5 D. The lower portion of the circle connects points on the bottom of the sidewall at opposite sides of the via so that the bottom of the via is entirely curved and has no flat portion. A conformal diffusion barrier is formed on the inner surface of the via and then a second metal layer is deposited to fill the via and is subsequently planarized so that the second metal layer is coplanar with the dielectric layer. The curvature at the via bottom helps to relieve stress near the diffusion barrier interface with the first and second metal layers and thereby increases electromigration resistance.

In a second embodiment, a via with a diameter D is formed as in the first embodiment except the via bottom is comprised of a flat bottom portion and a rounded bottom corner that connects the sidewall to the flat bottom. The portion of a circle with a radius R2 that ranges from a low value of 0.25 D to about 0.5 D is used to define the bottom rounded corner. The portion of the circle which connects a point on the bottom of the sidewall with the closet point on the edge of the flat bottom forms a curved bottom corner. The diameter D3 of the flat bottom is related to R2 and D by the equation $D3+2R2=D$. A conformal diffusion barrier layer is deposited on the sidewall and bottom of the via. A second metal layer is then deposited to fill the via and is subsequently planarized so that the second metal layer is coplanar with the dielectric layer. The curvature at the via bottom helps to relieve stress near the diffusion barrier interface with the first and second metal layers and thereby increases electromigration resistance.

In a third embodiment, the via hole is etched through the dielectric layer described in the first embodiment and stops in or on the TiN ARC layer. The via has a flat bottom and is filled with a diffusion barrier layer and second metal layer as previously mentioned. By stopping in or on the TiN ARC layer, the underlying first metal layer is not disturbed and is protected from materials used in subsequent process steps. Thus, corrosion or oxidation of the first metal layer is avoided and electromigration resistance is improved.

The invention is also a via structure in a semiconductor device where the via is filled with a conformal diffusion barrier layer and a second metal layer and is formed in a dielectric layer on a substrate. The dielectric layer is formed on a TiN ARC layer which is formed on a first metal layer. In one embodiment, the via extends through the TiN ARC layer and into the first metal layer and has a width D and a completely rounded bottom with no flat portion which is formed in the first metal layer. The bottom curvature of the via is defined by the lower portion of a circle having a radius R that connects the sidewall on opposite sides of the via. A maximum value of R is 1.5 D while a minimum value for R is about 0.5 D.

In another embodiment, a via structure filled with a conformal diffusion barrier layer and a second metal layer is formed in a dielectric layer on a substrate. The dielectric layer is formed on a TiN ARC layer which is formed on a first metal layer. The via extends through the TiN ARC layer and has a width D and a partially rounded bottom comprised of a flat portion and a rounded corner portion that connects the flat portion to the vertical sidewall. The curvature of the rounded corner is defined by the portion of a circle having a radius R2 that connects a point at the bottom of the sidewall with the closest point on the edge of the flat portion. R2 has a maximum value of about 0.5 D and a minimum value of 0.25 D.

In another embodiment, a via structure filled with a conformal diffusion barrier layer and a second metal layer is formed in a dielectric layer on a TiN ARC and has a flat bottom that stops in or on the TiN ARC layer.

DETAILED DESCRIPTION OF THE INVENTION

The present invention is a method which is particularly useful for forming a via structure that will serve as an electrical pathway between an underlying metal layer and an overlying metal layer in a semiconductor device. The via is designed to improve electromigration resistance associated with the junction between the underlying first metal layer and the second metal layer in the via.

Figure 1:
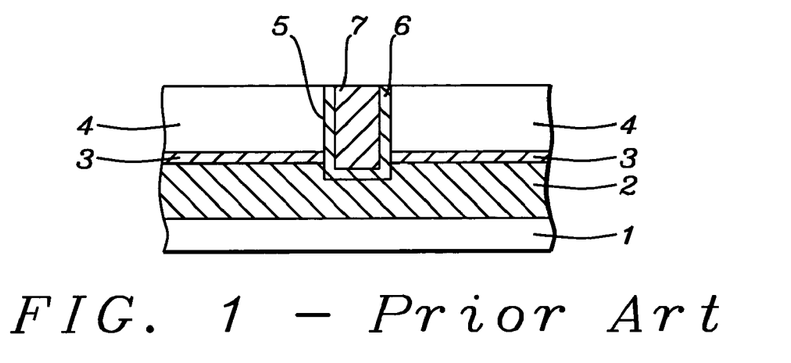
FIG. 1 is a cross-sectional view depicting a prior art via structure formed in a dielectric layer and in contact with an underlying metal layer.

A prior art via structure depicted in FIG. 1 is one that the inventors have found to be problematic in terms of forming stress related voids and increased resistivity over time as current is repeatedly flowed through the device containing the via. The structure consists of a substrate 1 that typically contains active and passive devices (not shown), a first metal layer 2 on substrate 1, a stack comprised of an upper dielectric layer 4 and a lower anti-reflective coating (ARC) 3 on first metal layer 2, and a via 5 comprised of a conformal diffusion barrier layer 6 and a second metal layer 7. The via 5 has a vertical sidewall that extends through dielectric layer 4 and ARC 3 and into first metal layer 2 and terminates in a flat bottom in first metal layer 2.

One or more events occur that degrade device performance as a current is repeatedly passed through the via structure shown in FIG. 1. First, a compressive stress builds in first metal layer 2 adjacent to diffusion barrier 6 at or near the bottom of via 5. Undesirable hillocks or extrusions may form, depending upon the amount of stress and the metal composition. A void may form as the result of tensile stress in second metal layer 7 at or near the bottom of via 5 which will lead to increased resistivity and ultimately device failure. Furthermore, loss of performance occurs if first or second metal layers are contaminated with oxide, nitride, or fluoride compounds that formed during device fabrication by exposure to process chemicals such as etchants and organic solutions. As a result, reliability suffers and device performance is often degraded below a satisfactory level.

The inventors have discovered an improved via structure with a flexible bottom shape and location that significantly increases resistance to electromigration and thereby improves reliability. A method for forming the improved via structure in a first embodiment where the via bottom is completely rounded with no flat portion is described with reference to FIGS. 2-4.

Figure 2:
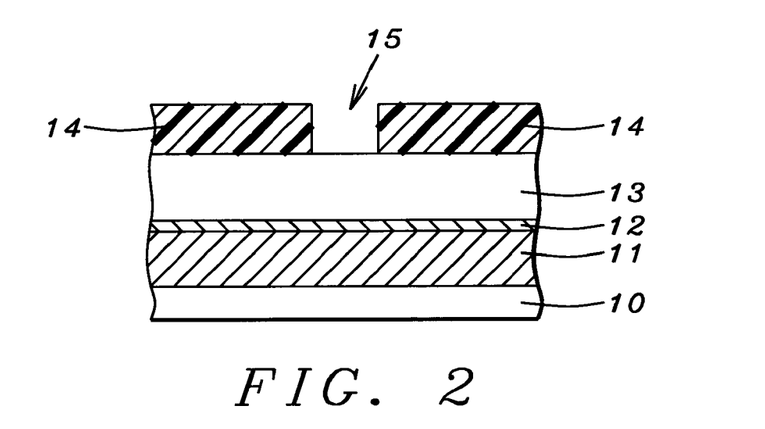
FIGS. 2-3 are cross-sectional views illustrating the formation of a via hole with a rounded bottom that is etched through a dielectric layer and into an underlying metal layer according to a first embodiment of the present invention.

Referring to FIG. 2, a substrate 10 is provided that is comprised of active and passive devices as well as conductive and insulating layers which are not shown in order to simplify the drawing. A first metal layer 11 which is preferably Al/Cu, AlSiCu, or copper and having a thickness of about 2000 to 10000 Angstroms is deposited on substrate 10 by a conventional method. Next, an ARC 12 that is preferably TiN with a thickness between about 200 and 800 Angstroms is deposited by a CVD or plasma enhanced CVD technique on first metal layer 11. Alternatively, ARC 12 is selected from a group including Ti/TiN, TaN, or Ta/TaN. Typically, a photoresist layer (not shown) is coated and patterned on ARC 12 to form openings which are subsequently plasma etched through ARC 12 and first metal layer 11 to form a metal line pattern. To simplify the drawings, only a portion of one metal line is depicted as first metal layer 11. The ARC 12 serves to control reflectivity off highly reflective first metal layer 11 during patterning of the photoresist which improves the process latitude of the lithography step.

A dielectric layer 13 is formed on ARC 12 by a CVD, plasma enhanced CVD, or a spin-on process and is comprised of $SiO_2$ with a dielectric constant (k) of about 4 or any one of a number of low k dielectric materials with a k value of less than 3.5. Examples of low k dielectric materials are fluorine doped $SiO_2$, carbon doped $SiO_2$, polyarylethers, borophosphosilicate glass, polysilsesquioxanes, fluorinated polyimides, and benzocyclobutene. Dielectric layer 13 has a thickness from about 2000 to 10000 Angstroms and may be heated at temperatures up to about 600° C. and/or treated with a plasma method known to those skilled in the art to densify the layer and stabilize its dielectric constant by preventing water uptake. Optionally, dielectric layer 13 is a composite layer comprised of a first dielectric layer that is deposited in a manner to provide good gap fill capability, for example, and a second dielectric layer that is deposited at a faster rate and may or may not be comprised of the same material as in the first dielectric layer.

A photoresist is coated and baked on dielectric layer 13 to form photoresist layer 14. Photoresist layer 14 is patterned by exposing with one or more wavelengths in the range of about 10 nm to 600 nm or optionally with a projection electron beam system to give a via opening 15 after developing substrate 10 in an aqueous base solution. It should be understood that while only one via opening is shown above first metal layer 11, the invention is equally effective with more than one via hole above first metal layer 11. Furthermore, when a plurality of via holes are present, they may be arrayed in several designs including isolated holes, semi-isolated holes, and dense hole patterns. Alternatively, an ARC (not shown) which may be a spin-0n organic layer or a CVD deposited inorganic material such as silicon oxynitride is formed on dielectric layer 13 prior to coating photoresist layer 14 in order to improve the process window for generating via opening 15.

Figure 3:
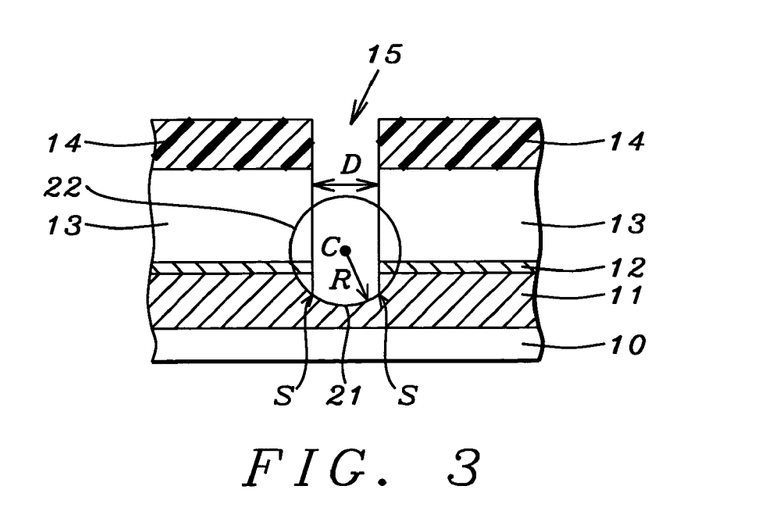

Referring to FIG. 3, a plasma etch process is used to transfer via opening 15 having a width D through dielectric layer 13. A first step employs a conventional plasma etch that is typically based on a fluorocarbon, oxygen, and an inert gas mixture to remove dielectric layer 13 exposed by via 15. Some of photoresist layer 14 may be consumed during the etch.

A second etch step which is a key feature of the invention is then performed to. transfer via opening 15 through ARC 12 and may or may not be carried out in the same chamber used for the first etch step. When ARC 12 is TiN, the second etch step is performed with the following conditions: a $C_4F_8$ gas flow rate of 10 to 12 standard cubic centimeters per minute (sccm); an $O_2$ flow rate of 3 to 5 sccm, a chamber pressure of 40 to 50 mTorr, a chamber temperature of from 20° C. to 60° C., and a RF power from about 1200 to 1500 Watts for a period of 45 to 200 seconds.

The second etch step also transfers via 15 into first metal layer 11 to form a rounded bottom 21 with no flat portion that is etched to a depth from 200 to 1000 Angstroms into first metal layer 11. The rounded bottom 21 has a shape which is defined by the lower portion of a circle 22 that has a center point C and a radius R and which connects points S at the bottom of the sidewall on opposite sides of via 15. Rounded bottom 21 is formed by rotating the circle 22 in a 180 degree arc on an axis (not shown) parallel to the vertical sidewall and containing center point C while maintaining contact with the bottom of the sidewall at opposite sides of via 15. In one aspect, the radius R has a maximum value of 1.5 D as shown in FIG. 3. R may decrease to about 0.5 D and circle 22 will still define a completely rounded bottom 21 on via 15 although the amount of curvature will change. The size of R partially depends upon the width D chosen for via 15. As D decreases to about 100 nm or below and an increased amount of stress is predicted, the size of R increases to about 1.5 D to compensate for the increased stress. Other factors that influence the size of R are the types of materials selected for first metal layer 11 and for the diffusion barrier layer and second metal layer that are subsequently deposited in via 15.

Any remaining photoresist layer 14 is stripped by a standard method that typically involves an organic solution which also removes organic residues from within via 15. Preferably, the stripper contains a corrosion inhibitor such as Aleg310 which is commercially available from Mallinkrodt-Baker Corporation. It is believed that an alcohol or amine component in the inhibitor forms a complex with first metal layer 11 to help prevent oxidation during and after subsequent processes.

Figure 4:
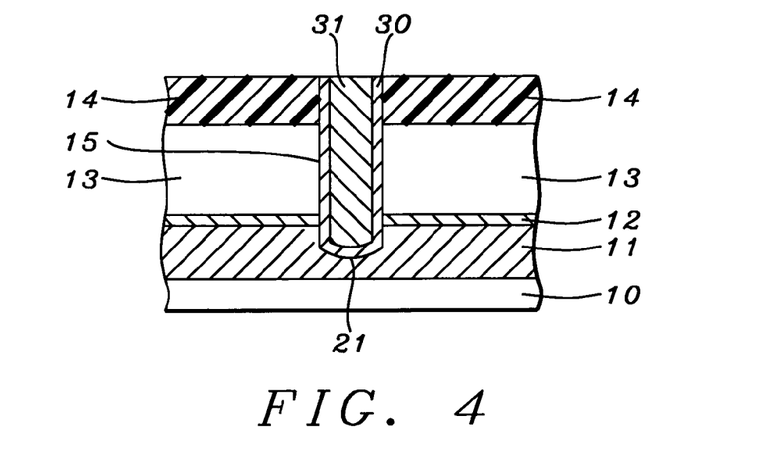
FIG. 4 is a cross-sectional view of the via structure in FIG. 3 after a diffusion barrier layer and metal layer are deposited and planarized according to the present invention.

Referring to FIG. 4, a diffusion barrier layer 30 is conformally deposited by a CVD, plasma enhanced CVD, or an atomic layer deposition (ALD) method on the sidewall and rounded bottom 21 of via 15. Diffusion barrier layer 30 is comprised of one or more materials that include Ta, TaN, TaSiN, Ti, TiN, TiW, W and WN and has a thickness of between about 50 and 500 Angstroms. Preferably, diffusion barrier layer 30 is a composite layer comprised of a first layer which is Ti with a 0 to 200 Angstrom thickness that is deposited by an ionized metal plasma (IMP) method and a second layer which is TiN with about a 50 to 300 Angstrom thickness.

The TiN layer is deposited with a CVD method. The Ti serves to prevent nitrogen in the TiN CVD deposition from reacting with Al in the first metal layer to form an undesirable AlN compound. The Ti layer may also prevent fluoride in a subsequent metal layer deposition from reacting with Al in the first metal layer to give an unwanted AlF compound. For example, $WF_6$ used in a W deposition, may diffuse through a TiN barrier layer and react with Al to yield AlF.

A second metal layer 31 which is preferably an Al/Cu alloy is deposited by a conventional means to fill via 15. Optionally, second metal layer 31 may be W, Al, or copper. A planarization process such as a chemical mechanical polish (CMP) method, for example, is employed to planarize second metal layer 31 and remove diffusion barrier layer 30 and second metal layer 31 above dielectric layer 13.

The present invention is also a semiconductor device comprised of a via structure depicted in FIG. 4 wherein a via 15 filled with a conformal diffusion barrier layer 30 and a second metal layer 31 is formed in a dielectric layer 13 on a substrate 10. Dielectric layer 13 is preferably formed on an ARC 12 which is formed on a first metal layer 11. The thickness and composition of first metal layer 11, ARC 12, and dielectric layer 13 are described in the first embodiment. ARC 12 is preferably TiN and the via 15 extends through the TiN ARC 12 and has a width D and a bottom curvature which is formed in the first metal layer 11. Referring to FIG. 3, the curved shape at via bottom 21 is defined by the lower portion of a circle 22 having a radius R that connects points S at the bottom of the vertical sidewall on opposite sides of via 15. R varies from a maximum value of 1.5 D to a minimum value of about 0.5 D. The via bottom 21 is preferably a continuous curve and has no flat portion and is formed by rotating circle 22 about an axis which is parallel to the sidewall of via 15 and contains center point C.

The conformal diffusion barrier layer 30 is preferably a composite layer comprised of a first layer of Ti having a thickness from about 0 to 200 Angstroms and a second layer consisting of TiN with a thickness between about 50 and 300 Angstroms. Optionally, diffusion barrier layer 30 may be a single layer or a composite layer selected from a group of materials including Ta, TaN, TaSiN, Ti, TiN, TiW, W, and WN. Second metal layer 31 is an Al/Cu alloy, W, or copper. The top surface of diffusion barrier layer 30 and second metal layer 31 are coplanar with dielectric layer 13.

One advantage of the first embodiment and the device that includes the via structure formed by the first embodiment is that a higher electromigration resistance is provided as indicated by the increase in device lifetime listed in Table 1. A device having a prior art via structure shown in FIG. 1 that has a filled via 5 which terminates in a flat bottom in a first metal layer 2 has a lifetime of about $1.68 \times 10^5$ hours as measured by an electromigration (EM) test which was performed at 200° C. to 250° C. with a current density of 1 $MA/cm^2$ using Destin equipment. On the other hand, a via structure having a round bottom as formed by the first embodiment of the present invention has an increased lifetime of between $5 \times 10^5$ and $2 \times 10^6$ hours which means improved reliability.

TABLE 1

Electromigration Test Results (1 $MA/cm^2$ at 250° C.)

| Via bottom shape/ location | Ti thickness in diffusion barrier | TiN thickness in diffusion barrier | Lifetime (hours) |
|---|---|---|---|
| Conventional flat bottom in metal | 150 Angstroms | 50 Angstroms | $1.68 \times 10^6$ |
| Round bottom in metal layer | 150 Angstroms | 50 Angstroms | $7.70 \times 10^5$ |
| Round bottom in metal layer | 150 Angstroms | 50 Angstroms | $1.00 \times 10^6$ |

Figure 5:
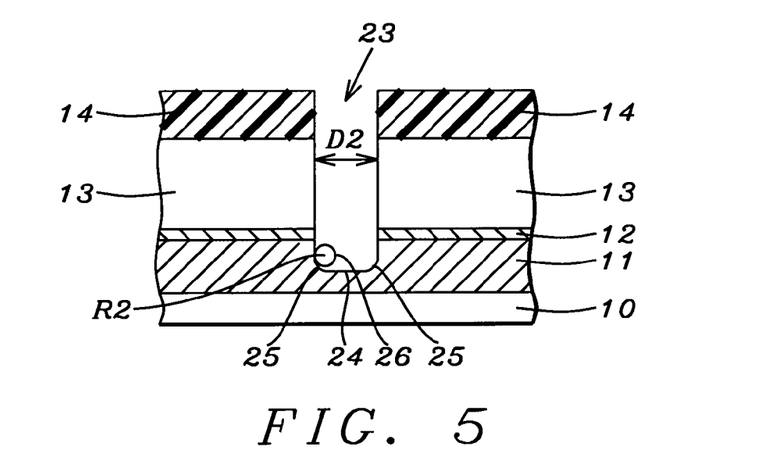
FIGS. 5-6 are cross-sectional views showing a via hole with a partially rounded bottom that is etched through a dielectric layer and into an underlying metal layer according to a second embodiment of the present invention.
Figure 6:
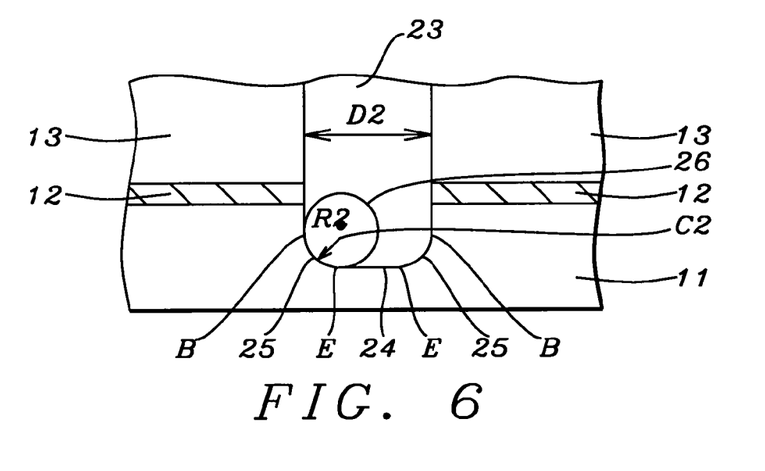
Figure 7:
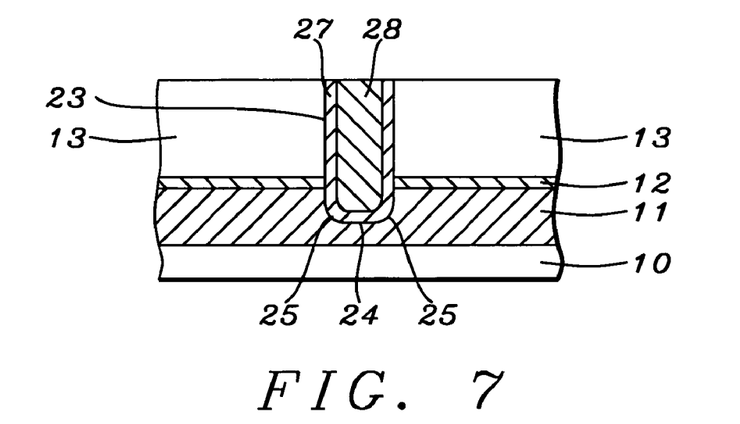
FIG. 7 is a cross-sectional view of the via structure in FIG. 6 after a diffusion barrier layer and metal layer are deposited and planarized according to the present invention.

A second embodiment of the present invention is illustrated in FIGS. 5 to 7. Referring to FIG. 5, a via opening 23 is formed in a photoresist layer 14 on a stack of layers comprised of a dielectric layer 13, ARC 12, and first metal layer 11 on a substrate 10 which is typically comprised of active and passive devices in addition to insulating and conductive layers (not shown). The composition and thickness of first metal layer 11, ARC 12, and dielectric layer 13 are the same as described in the first embodiment.

While only one via opening 23 is shown above first metal layer 11, the invention is equally effective with more than one via hole above first metal layer 11. Furthermore, when a plurality of via holes are present, they may be arrayed in several designs including isolated holes, semi-isolated holes, and dense hole patterns. Alternatively, an ARC (not shown) which may be a spin-on organic layer or a CVD deposited inorganic material such as silicon oxynitride is formed on dielectric layer 13 prior to coating photoresist layer 14 in order to improve the process window for generating via opening 23.

A plasma etch process is used to transfer via opening 23 having a width D2 through dielectric layer 13. A first step employs a conventional plasma etch that is typically based on a fluorocarbon, oxygen, and an inert gas mixture to remove dielectric layer 13 exposed by via 23. Some of photoresist layer 14 may be consumed during the etch.

A second etch step is then performed to transfer via opening 23 through ARC 12 which is preferably TiN but also may be Ti/TiN, Ta/TaN or TaN. The second etch step may or may not be carried out in the same chamber used for the first etch step. When ARC 12 is TiN, the second etch step is performed with the following conditions: a $SF_6$ flow rate of 50 to 60 sccm; an inert gas flow; a chamber pressure of 60 to 70 mTorr, a chamber temperature of from 20° C. to 60° C., and a RF power from about 300 to 500 Watts for a period of 12 to 60 seconds. The second etch step also transfers via 23 into first metal layer 11 to generate a via comprised of a vertical sidewall, a flat portion 24 and a curved bottom corner 25.

Referring to FIG. 6 which is a cross-sectional view where the bottom portion of the via 23 in FIG. 5 is enlarged, the radius R2 is the distance between a center point C2 for circle 26 and a point on the curved bottom corner 25 of via 23. From a top-down perspective (not shown), flat portion 24 is a circular shape having a diameter D3. From a side view in FIG. 6, D3 is the distance between points E at opposite ends of flat portion 24. The curved shape at bottom corner 25 is defined by the portion of a circle 26 between points B and E. Circle 26 has a radius R2 that may vary from a maximum value of 0.5 D2 to a minimum value of about 0.25 D2. Bottom corner 25 is formed by sweeping the circle 26 in a 360 degree arc about an axis (not shown) that is parallel to the via sidewall and passes through the center of flat portion 24 while keeping the circle 26 in contact with the bottom of the via sidewall B and the outer edge E of the flat portion 24. Note that D3+2R2=D2 and C2 is located above the perimeter E of flat portion 24.

The size of R2 that is selected partially depends on the width D2 chosen for via 23. As D2 decreases to about 200 nm or below and an increased amount of stress is anticipated, the size of R2 increases to about 0.5×D2 to compensate for the anticipated stress. Other factors that influence the size of R2 are the types of materials selected for first metal layer 11 and for the diffusion barrier layer and second metal layer that are subsequently deposited in via 23.

Any remaining photoresist layer 14 is stripped by a standard method that typically involves an organic solution which also removes organic residues from within via 23. Preferably, the stripper contains a corrosion inhibitor such as Aleg310 which is commercially available from Mallinkrodt-Baker Corporation. It is believed that an alcohol or amine component in the inhibitor forms a complex with first metal layer 11 to help prevent oxidation during and after subsequent processes.

Referring to FIG. 7, a diffusion barrier layer 27 is conformally deposited by a CVD, plasma enhanced CVD, or ALD method on the sidewall, flat bottom 24, and rounded corner 25 of via 23. Diffusion barrier layer 27 is selected from a group of materials that include Ta, TaN, TaSiN, Ti, TiN, TiW, W, and WN and has a thickness of between about 50 and 500 Angstroms. Preferably, diffusion barrier layer 27 is a composite layer comprised of a first layer which is Ti with a 0 to 200 Angstrom thickness that is deposited by an IMP method and a second layer which is TiN with a 50 to 300 Angstrom thickness. The TiN layer is deposited with a CVD method. The Ti serves to prevent nitrogen in the TiN CVD deposition from reacting with Al in the first metal layer to form an undesirable AlN compound and may also prevent fluoride in a subsequent metal layer deposition from reacting with Al in the first metal layer to give an unwanted AlF compound. For example, $WF_6$ used in a W deposition, may diffuse through a TiN barrier layer and react with Al in a first metal layer to yield AlF.

A second metal layer 28 which is preferably an Al/Cu alloy is deposited by a conventional means to fill via 23. Optionally, second metal layer 28 may be W, Al, or copper. A planarization process such as a CMP method is employed to planarize second metal layer 28 and remove diffusion barrier layer 27 and second metal layer 28 above dielectric layer 13.

The present invention is also a semiconductor device comprised of a via structure depicted in FIG. 7 that includes a via 23 filled with a conformal diffusion barrier layer 27 and a second metal layer 28 that is formed in a dielectric layer 13 on a substrate 10. Dielectric layer 13 is preferably formed on an ARC 12 which is formed on a first metal layer 11. The thickness and composition of first metal layer 11, ARC 12, and dielectric layer 13 are described in the first embodiment. ARC 12 is preferably TiN and the via 23 extends through the TiN ARC 12 and has a width D2 and a partially rounded bottom comprised of bottom corner 25 and a flat portion 24 which is formed in the first metal layer 11. Referring to FIG. 6, the curved shape at bottom corner 25 is defined by the portion of a circle 26 between points B and E. Circle 26 has a radius R2 that may vary from a maximum value of 0.5 D2 to a minimum value of about 0.25 D2. Bottom corner 25 is formed by sweeping the circle 26 in a 360 degree arc about an axis that is parallel to the via sidewall and passes through the center of flat portion 24 while keeping the circle 26 in contact with the bottom of the via sidewall B and the outer edge E of the flat portion 24.

One advantage of the second embodiment and the device that includes the via structure formed by the second embodiment is that a higher electromigration resistance is provided as indicated by the increase in device lifetime listed in Table 1. A prior art structure as shown in FIG. 1 that has a filled via 5 which terminates in a flat bottom in a first metal layer 2 has a lifetime of about $1.68 \times 10^5$ hours as measured by an electromigration (EM) test which was performed at 200° C. to 250° C. with a current density of 1 $MA/cm^2$. On the other hand, a via structure having a partially rounded bottom as formed by the second embodiment of the present invention has an increased lifetime of up to $1.00\ 10^6$ hours which means improved reliability.

A third embodiment of the present invention is illustrated in FIGS. 8 to 12 and involves a via structure formed in a dielectric layer that stops on or in an ARC layer on a first metal layer on a semiconductor substrate. This embodiment may be preferred over the first or second embodiments in situations where a loss of performance is anticipated by etching into the first metal layer. In the third embodiment, the exposure of the first metal layer to chemicals in subsequent processes is significantly reduced or eliminated by leaving an ARC layer between the first metal layer and via structure.

Figure 8:
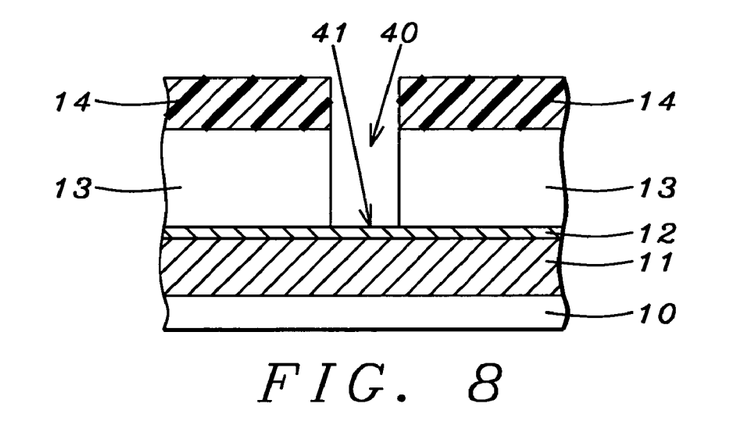
FIGS. 8-9 are cross-sectional views showing a via that stops on an ARC layer above a metal layer and which is subsequently filled with a diffusion barrier and a metal layer according to a third embodiment of the present invention.

Referring to FIG. 8, a via opening 40 is formed in a photoresist layer 14 on a stack of layers comprised of a dielectric layer 13, ARC 12, and first metal layer 11 on a substrate 10 which is typically comprised of active and passive devices in addition to insulating and conductive layers (not shown). The composition and thickness of first metal layer 11, ARC 12, and dielectric layer 13 are the same as described in the first embodiment. Optionally, an organic ARC or inorganic ARC layer (not shown) is formed on dielectric layer 13 prior to coating photoresist layer 14 in order to improve the process window for generating via 40. While only one via opening 40 is shown above first metal layer 11, the invention is equally effective with more than one via hole above first metal layer 11. Furthermore, when a plurality of via holes are present, they may be arrayed in several designs including isolated, semi-isolated, and dense hole patterns.

A plasma etch process is used to transfer via opening 40 through dielectric layer 13 and stops on ARC 12 which is preferably TiN but also may be Ti/TiN, Ta/TaN or TaN. Via bottom 41 is about coplanar with ARC layer 12. The etch process is based on a fluorocarbon, oxygen, and an inert gas chemistry and is typically performed at a higher pressure and a lower power than the etch process through dielectric layer 13 in the first two embodiments. Some of photoresist layer 14 may be consumed during the etch. The remaining photoresist layer 14 and any organic residues in via 40 are removed by an organic stripper that preferably includes a commercially available corrosion inhibitor such as Aleg310.

Figure 9:
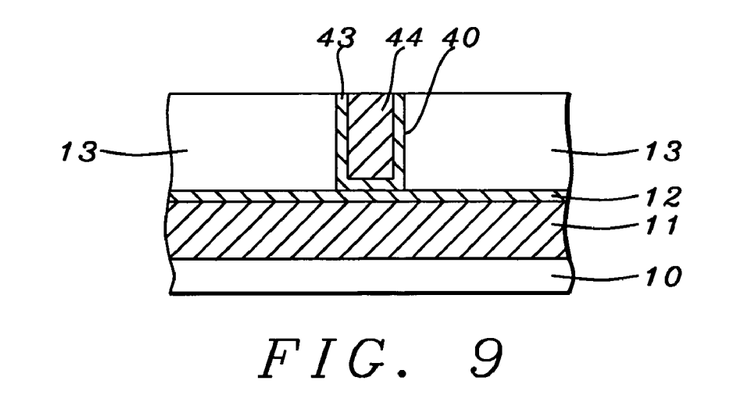

Referring to FIG. 9, a diffusion barrier layer 43 is conformally deposited by a CVD, plasma enhanced CVD, or ALD method on the sidewall and bottom of via 40. Diffusion barrier layer 43 is selected from a group of materials that include Ta, TaN, TaSiN, Ti, TiN, TiW, W, and WN and has a thickness of between about 50 and 800 Angstroms. Preferably, diffusion barrier layer 43 is a composite layer comprised of a first layer which. is Ti with a 0 to 200 Angstrom thickness that is deposited by an IMP method and a second layer which is TiN with a 50 to 300 Angstrom thickness. The TiN layer is deposited with a CVD method. The Ti serves to prevent nitrogen in the TiN CVD deposition from diffusing through TiN ARC 12 and into the first metal layer 11 to form an undesirable AlN compound AlF compound and may also prevent fluoride in a subsequent metal layer deposition from diffusing through TiN and reacting with Al in the first metal layer 11 to give an unwanted AlF compound. For example, $WF_6$ used in a W deposition, may diffuse through a TiN layer and react with Al in a first metal layer 11 to yield AlF.

A second metal layer 44 which is preferably an Al/Cu alloy but may also be W, Al, or copper is deposited by a conventional means to fill via 40. A planarization process such as a CMP method is employed to planarize second metal layer 44 and remove diffusion barrier layer 43 and second metal layer 44 above dielectric layer 13.

Alternatively, the via 40 depicted in FIG. 8 may be transferred partially into ARC layer 12 by a second etch step or by continuing the first etch beyond a point where via bottom 41 is about coplanar with ARC 12 for a predetermined amount of time. When TiN is employed as an ARC 12, the second etch step for the first embodiment described previously is performed for a period of about 50 to 80 seconds.

Figure 10:
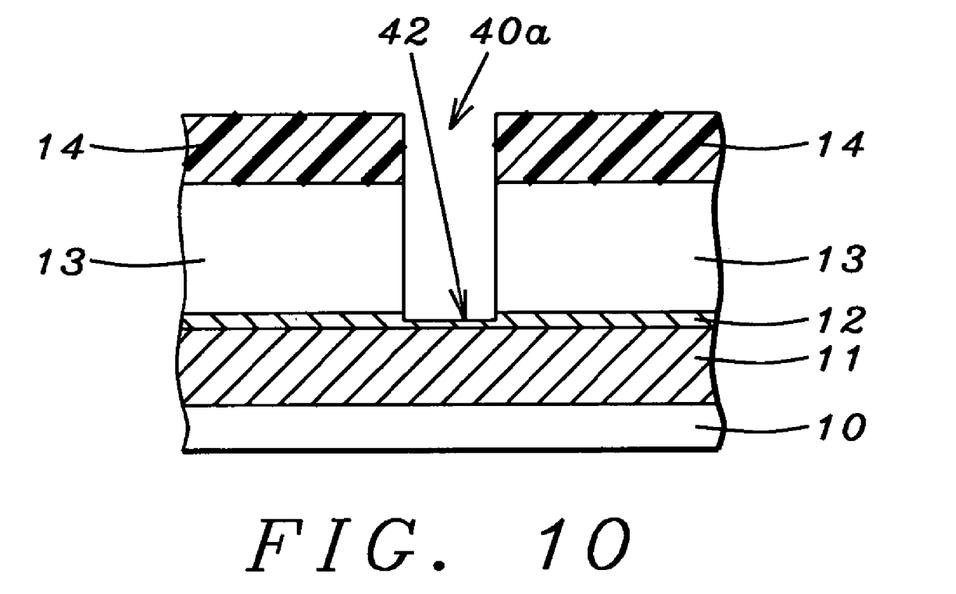
FIGS. 10-11 are cross-sectional views showing a via that stops in an ARC layer above a metal layer and which is subsequently filled with a diffusion barrier and a metal layer according to a third embodiment of the present invention.
Figure 11:
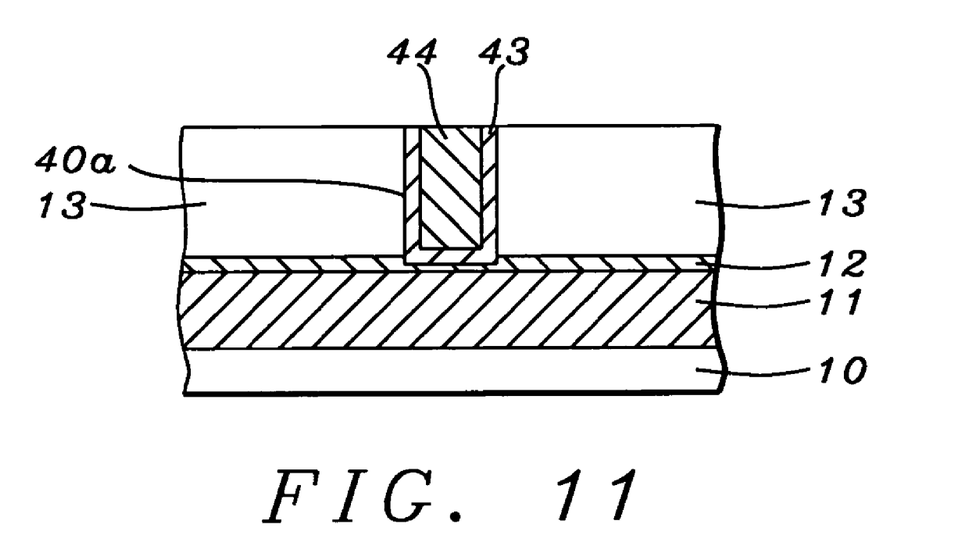

As a result, an extended via 40a with a flat bottom 42 is generated in ARC 12 which is preferably TiN as depicted in FIG. 10. In another embodiment, a via 40 as shown in FIG. 8 will be formed in one region of dielectric layer 13 on substrate 10 and a via 40a will be formed in another region of dielectric layer 13. This situation is likely to occur due to non-uniformities such as slight photoresist thickness variations or etch rate variations across a substrate or because of a design that includes both isolated and dense via holes. Densely packed vias tend to etch faster than isolated vias. Therefore, via 40a is representative of a via in a dense array while via 40 is representative of an isolated via formed in the same photoresist 14 layer.

Photoresist 14 and any organic residues in via 40a (and via 40) are removed by an organic stripper that preferably contains a corrosion inhibitor such as Aleg310. A diffusion barrier layer 43 and second metal layer 44 described previously are then deposited within via 40a.

The present invention is also a semiconductor device that includes the via structure depicted in FIG. 8 comprised of a via 40 filled with a conformal diffusion barrier layer 43 and a second metal layer 44 that is formed in a dielectric layer 13 on a substrate 10. Dielectric layer 13 is preferably formed on an ARC 12 which is formed on a first metal layer 11. The thickness and composition of first metal layer 11, ARC 12, and dielectric layer 13 are described in the first embodiment. ARC 12 is preferably TiN and the via 40 stops on the TiN ARC 12 and has a flat bottom. Optionally, the via structure has an extended sidewall and a flat bottom that is formed in ARC 12 as depicted in FIG. 10.

One advantage of the third embodiment and the device that includes the via structure formed by the third embodiment is that a higher electromigration resistance is provided as indicated by the increase in device lifetime listed in Table 2. A device with a prior art structure as shown in FIG. 1 that has a filled via 5 which terminates in a flat bottom in a first metal layer 2 has a lifetime of about $1.68 \times 10^5$ hours as measured by an electromigration (EM) test which was performed at 200° C. to 2500 C with a current density of 1 MA/cm². A via structure with a flat bottom that stops on a TiN ARC (FIG. 8) has an increased lifetime of up to $1.69 \times 10^6$ hours which indicates improved reliability.

TABLE 2

Electromigration Test Results (1 MA/cm² at ° C.)

| Via bottom shape/location | Ti thickness in diffusion barrier | TiN thickness in diffusion barrier | Lifetime (hours) |
|---|---|---|---|
| Conventional flat bottom in metal | 150 Angstroms | 50 Angstroms | $1.68 \times 10^5$ |
| Flat bottom on TiN ARC | 100 Angstroms | 50 Angstroms | $1.64 \times 10^6$ |
| Flat bottom on TiN ARC | 150 Angstroms | 50 Angstroms | $1.69 \times 10^6$ |

The invention provides an additional advantage over prior art methods and via structures in that the via bottom shape is flexible and may vary from a flat bottom to a completely rounded bottom in order to optimize electromigration resistance for a particular set of materials and wiring design. The via bottom profile selection is based on a relative importance of several process concerns that include amount of compressive and tensile stress, first and second metal contamination issues, type of metal alloy, thickness and composition of the diffusion barrier layer, and the width of the via structure. Thus, an integration approach to improving electromigration performance in a semiconductor device is achieved.

While this invention has been particularly shown and described with reference to, the preferred embodiments thereof, it will be understood by those skilled in the art that various changes in form and details may be made without departing from the spirit and scope of this invention.

What is claimed is:

1. A semiconductor device, comprising:
a first metal layer formed on a semiconductor substrate;
an anti-reflective (ARC) layer formed on said first metal layer;
a dielectric layer formed on said ARC layer; a via hole comprised of a vertical sidewall and a via bottom having a curvature wherein said vertical sidewall is formed in said dielectric layer and extends through said ARC layer into said first metal layer and wherein said via bottom is formed in said first metal layer;
a conformal diffusion barrier layer formed on the sidewall and bottom of said via hole and having a top surface that is coplanar with the dielectric layer; and
a second metal layer formed on said diffusion barrier layer that fills said via hole and is coplanar with said dielectric layer and said diffusion barrier layer.

2. The semiconductor device of claim 1 wherein said first metal layer is comprised of an Al/Cu alloy, AlSiCu, or copper and has a thickness from about 1000 to 10000 Angstroms.

3. The semiconductor device of claim 1 wherein said ARC layer is TiN, TaN, Ti/TiN, or Ta/TaN having a thickness from about 200 to 800 Angstroms.

4. The semiconductor device of claim 1 wherein said dielectric layer has a thickness between about 2000 and 10000 Angstroms and is selected from a group including $SiO_2$, fluorine doped $SiO_2$, carbon doped $SiO_2$, poly (arylethers), polysilsesquioxanes, fluorinated polyimides, and benzocyclobutene.

5. The semiconductor device of claim 1 wherein said via is part of a via pattern that includes isolated via holes, dense via holes, and semi-isolated via holes.

6. The semiconductor device of claim 1 wherein said curvature in the via bottom is defined by the lower portion of a circle having a radius R that connects points at the bottom of said sidewall on opposite sides of the via and wherein R has a maximum value of 1.5 D and a minimum value of about 0.5 D where D is the diameter of said via.

7. The semiconductor device of claim 1 wherein said via bottom is comprised of a flat bottom portion and a curved bottom corner and wherein said curvature is defined by the portion of a circle having a radius R2 that connects a point on the bottom of said sidewall with the closest point at the edge of said flat bottom portion, said radius R2 having a minimum value of 0.25 D and a maximum value of about 0.5 D where D is the diameter of said via.

8. The semiconductor device of claim 7 wherein said flat bottom portion has a circular shape from a top-down view with a diameter D3 where D3+2R2 is equal to D.

9. The semiconductor device of claim 1 wherein said diffusion barrier layer is comprised of one or more of Ti, TiN, TiW, Ta, TaN, TaSiN, W, and WN.

10. The semiconductor device of claim 1 wherein said diffusion barrier layer is a composite layer comprised of a first layer of Ti having a thickness from about 0 to 200 Angstroms and a second layer of TiN with a thickness of about 50 to 300 Angstroms.

11. The semiconductor device of claim 1 wherein said second metal layer is an Al/Cu alloy, Al, W, or copper.

12. The semiconductor device of claim 1 wherein said device has an electromigration resistance which is higher than a device comprised of a via with a flat bottom with no curvature and vertical sidewalls formed in said dielectric and ARC layers that extend into said first metal layer.

* * * * *